US010165670B2

(12) United States Patent
Roan et al.

(10) Patent No.: US 10,165,670 B2
(45) Date of Patent: Dec. 25, 2018

(54) ELECTRICAL CONNECTOR ASSEMBLY

(71) Applicant: Deere & Company, Moline, IL (US)

(72) Inventors: Thomas J. Roan, Fargo, ND (US); Andrew J. Wieland, Fargo, ND (US); Brij N. Singh, West Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 18 days.

(21) Appl. No.: 15/381,799

(22) Filed: Dec. 16, 2016

(65) Prior Publication Data

US 2017/0318660 A1 Nov. 2, 2017

Related U.S. Application Data

(63) Continuation-in-part of application No. 15/142,433, filed on Apr. 29, 2016, now Pat. No. 9,859,624.

(51) Int. Cl.
*G01R 19/00* (2006.01)
*H01K 1/02* (2006.01)
(Continued)

(52) U.S. Cl.
CPC ......... *H05K 1/0204* (2013.01); *G01R 15/207* (2013.01); *G01R 19/0092* (2013.01);
(Continued)

(58) Field of Classification Search
CPC ...... G01R 15/12; G01R 15/144; G01R 19/00; G01R 19/30; G01R 21/06; G01R 31/261; G01R 31/2623; G01R 15/20; G01R 15/202; G01R 21/08; G01R 33/06; G01R 33/07; G01R 33/077; G01R 33/075; G01D 5/142; G05G 2009/0475; H01R 13/5213; H01R 13/5219; H01R 12/714; H01R 13/22;
(Continued)

(56) References Cited

U.S. PATENT DOCUMENTS 5,508,611 A * 4/1996 Schroeder ................ F02P 7/07 174/545
6,280,247 B1 8/2001 Wu et al.
(Continued)

FOREIGN PATENT DOCUMENTS

EP 1450176 A1 8/2004
EP 2434583 A1 3/2012

OTHER PUBLICATIONS

European Search Report issued in counterpart application No. 171636814 dated Jan. 4, 2018. (9 pages).

*Primary Examiner* — Tung X Nguyen
*Assistant Examiner* — Robert P Alejnikov, Jr.

(57) ABSTRACT

An electrical connector assembly includes a first electrically conductive contact member and a second electrically conductive contact member. Both contact members have non-planar interface surfaces. The second interface surface is complimentary to the first interface surface. Magnetic field concentrators are spaced apart to concentrate a magnetic field in a zone. The magnetic field is associated with electric current carried by the electrical connector assembly. A flexible circuit carrier has openings to receive the magnetic field concentrators. The flexible circuit carrier comprises a flexible dielectric layer and a conductive traces. A magnetic field sensor is mounted on the flexible circuit carrier in the zone.

14 Claims, 9 Drawing Sheets

(51) Int. Cl.

| | |
|---|---|
| ***H05K 1/02*** | (2006.01) |
| ***G01R 15/20*** | (2006.01) |
| ***H01R 4/18*** | (2006.01) |
| ***H01R 4/30*** | (2006.01) |
| ***H05K 1/03*** | (2006.01) |
| ***H05K 1/11*** | (2006.01) |
| ***H05K 1/18*** | (2006.01) |
| ***H01R 13/66*** | (2006.01) |
| ***G01R 31/36*** | (2006.01) |
| *H01R 4/02* | (2006.01) |
| *H01R 4/04* | (2006.01) |
| *H01R 4/34* | (2006.01) |
| *H01R 12/53* | (2011.01) |

(52) U.S. Cl.
CPC ......... *G01R 31/3606* (2013.01); *H01R 4/183* (2013.01); *H01R 4/304* (2013.01); *H01R 13/6683* (2013.01); *H05K 1/0346* (2013.01); *H05K 1/0393* (2013.01); *H05K 1/111* (2013.01); *H05K 1/115* (2013.01); *H05K 1/181* (2013.01); *H05K 1/189* (2013.01); *H01R 4/023* (2013.01); *H01R 4/04* (2013.01); *H01R 4/34* (2013.01); *H01R 12/53* (2013.01); *H05K 2201/0154* (2013.01); *H05K 2201/10151* (2013.01); *H05K 2201/10318* (2013.01)

(58) Field of Classification Search
CPC H01R 13/24; H01R 13/2407; H01R 13/2414; H01R 13/2421; H01R 24/38; H01R 9/0506; H01R 13/03
USPC .......... 324/226, 207.2, 117 H, 263; 439/279, 439/289, 579, 886
See application file for complete search history.

(56) References Cited

U.S. PATENT DOCUMENTS

| | | | | | |
|---|---|---|---|---|---|
| 6,305,991 | B1 * | 10/2001 | Gerster | H01R 4/26 | 439/801 |
| 6,855,012 | B2 * | 2/2005 | An | H01R 11/12 | 439/793 |
| 7,503,776 | B1 | 3/2009 | Pavlovic et al. | | |
| 2005/0055841 | A1 * | 3/2005 | Scherzinger | G01B 7/105 | 33/834 |
| 2008/0186021 | A1 * | 8/2008 | Hashio | G01R 15/207 | 324/225 |
| 2011/0101970 | A1 * | 5/2011 | Lanter | G01B 7/003 | 324/207.25 |
| 2013/0285825 | A1 * | 10/2013 | Peczalski | G01R 33/0011 | 340/664 |
| 2014/0132123 | A1 * | 5/2014 | Berney | G01R 33/07 | 310/68 B |
| 2014/0170864 | A1 * | 6/2014 | Hwang | H01R 13/6205 | 439/38 |
| 2015/0017831 | A1 | 1/2015 | Wang et al. | | |
| 2015/0309080 | A1 * | 10/2015 | Chae | G01R 15/202 | 324/251 |

* cited by examiner 18
17
722
724
12
22
14
16
34
32
26
30
36
21
20
32
34
36
30
28
32
32
34
47
32
36
30
24
724
40
722

16
21
316
12
18
17
14
22
30
32
26
34
36
28
24
20
47

16
21
316
12a
18
17
14a
22a
30a
34a
32a
47
36a
10
32a
34a
30a
36a
20a

ELECTRICAL CONNECTOR ASSEMBLY

RELATED APPLICATION

This is a continuation-in-part of U.S. patent application Ser. No. 15/142,433, filed on Apr. 29, 2016, which is hereby incorporated by reference into this document.

TECHNICAL FIELD

The present disclosure relates to an electrical connector assembly for electrical conductors.

BACKGROUND

Power electronic modules or power inverters can be designed for normal load conditions or overload conditions on vehicles. At peak load conditions, appropriate thermal management is critical. For example, as inverters deal with the peak load current, the interface between two mating conductors or contacts becomes more critical because this interface can be a bottleneck for electrical current and thermal heat flow. There is an inherent resistance at the interface which generates heat. This also hinders thermal flow used for cooling, which makes heat management difficult. To reduce electrical resistance at the contact interface, the outside envelope size of the contacts can be increased. However, this results in an inefficient use of space within the inverter. It is desired to reduce electrical resistance at the contact interface without increasing the outside envelope size of the contacts.

SUMMARY

In one embodiment, an electrical connector assembly includes a first electrically conductive contact member having a non-planar first interface surface, and a second electrically conductive contact member having a non-planar first interface surface. The second contact member has a non-planar second interface surface which is complementary to a first interface surface of the first contact member. Magnetic field concentrators are spaced apart to concentrate a magnetic field in a zone. The magnetic field is associated with electric current carried by the electrical connector assembly. A flexible circuit carrier has openings to receive the magnetic field concentrators. The flexible circuit carrier comprises a flexible dielectric layer and a conductive traces. A magnetic field sensor is mounted on the flexible circuit carrier in the zone to detect the magnetic field; hence, measure the current carried by the electrical connector assembly.

DETAILED DESCRIPTION OF THE DRAWINGS

Figure 1:
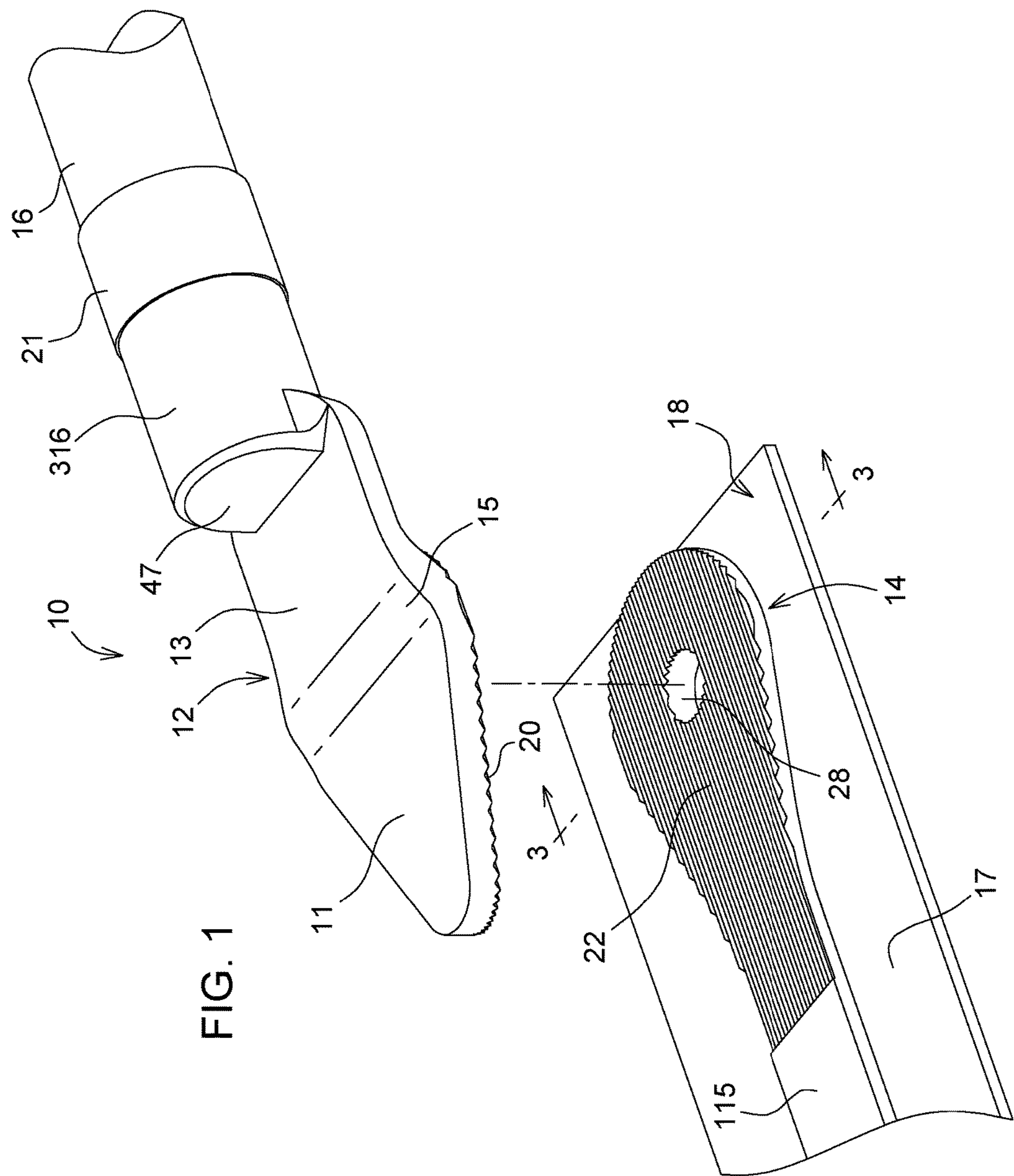
FIG. 1 is an exploded perspective view an electrical connector assembly in accordance with the disclosure.
Figure 2:
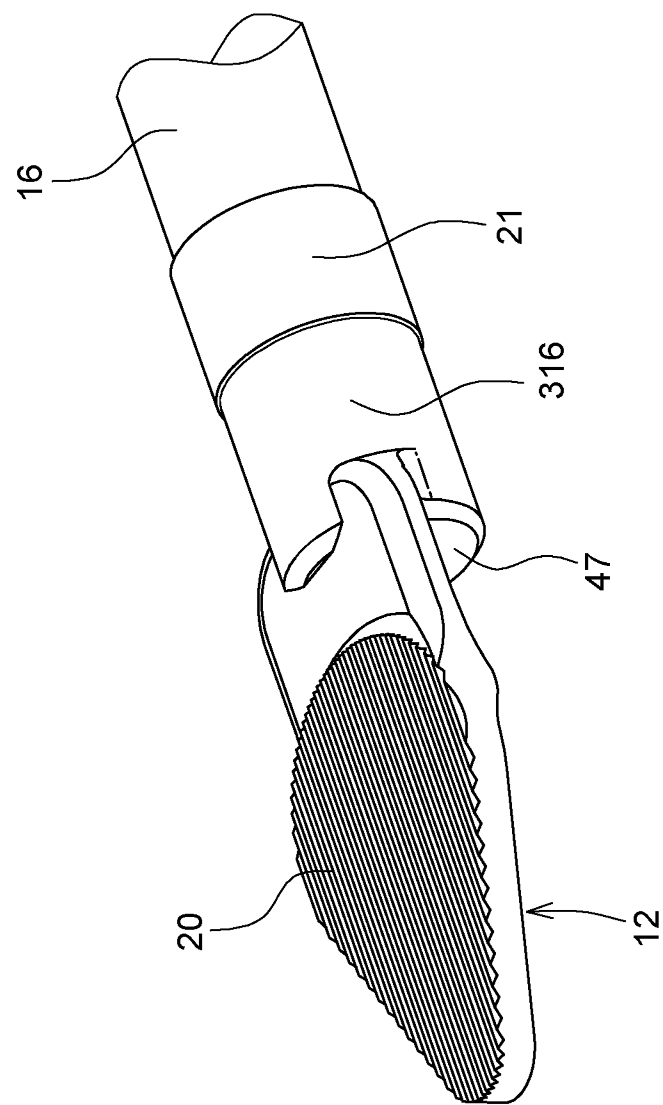
FIG. 2 is a perspective view of one of the contact elements of FIG. 1.

In FIG. 1 and FIG. 2, an electrical connector assembly 10 includes an electrically conductive first contact 12 and an electrically conductive second contact 14. The first contact 12 includes an outer portion 11 and an inner portion 13 which is offset from the outer portion 11.

The inner portion 13 of the first contact 12 terminates in a socket 316 that comprises an optional terminating end 47, which may extend in a generally perpendicular direction with respect to the inner portion 13. In one embodiment, the socket 316 is a generally hollow member for receiving conductor 16. For example, the socket 316 has an interior recess, such as a substantially cylindrical recess, for receiving a conductor 16 (e.g., stripped of dielectric insulation) that is soldered, welded (e.g., welded sonically), brazed, bonded, crimped or otherwise connected. The conductor 16 may comprise a cable, a wire, a twisted wire or cable, a solid wire, or another suitable conductor for transmitting electrical energy.

In an alternate embodiment, the socket 316 the optional terminating end 47 may be removed or bored out such that the conductor 16 may extend through the socket 316 to be welded, soldered or otherwise mechanically and electrically connected to the (upper) surface or inner portion 13 of the first contact. Further, the outer portion 11 can be larger, such as longer and wider, to accommodate the thermal dissipation.

As illustrated, the outer portion 11 of the first contact 12 has a generally triangular shape, a tear-drop shape, or arrow-head shape with a rounded tip or rounded point, although other embodiments may have different shapes. The inner portion 13 is connected to the outer portion 11 by a step or transition portion 15. For example, the transition portion 15 provides a greater surface area for dissipating heat from one or more heat generating components of a circuit board or substrate, where the inner portion 13 and the outer portion 11 are offset in generally parallel planes with respect to each other.

The first contact 12 may be attached to an end of an electrical conductor 16, whereas the second contact 14 may be connected or coupled to one or more heat generating components of a power inverter (not shown) or power electronics module. The conductor 16 may be soldered, welded, brazed, crimped or otherwise connected to the first contact 12 (e.g., at the socket 316). In one embodiment, the first contact 12 may have a socket 316 with a substantially cylindrical surface, or bore. Further, an exterior of the socket 316 may engage or mate with a collar or sleeve 21 to receive or secure the conductor 16 and to facilitate the electrical and mechanical connection between the wire and the first contact 12.

In one embodiment, the second contact 14 may be mounted to an electrically insulating substrate 18, such as a circuit board. The first contact 12 has a first contact surface 20, and second contact 14 has a second contact surface 22. In one embodiment, the first contact surface 20 mates with the second contact surface 22 directly or indirectly via an intervening layer of solder, braze, electrically conductive fluid (e.g., electrically conductive grease) or electrically conductive adhesive (e.g., polymer or plastic matrix with metallic filler).

In certain embodiments, materials used for manufacturing could be base metal, an alloy or metals, and or composite of metals. However, it needs to be ensured that manufacturing processes and choice of materials used in manufacturing are accurate enough to achieving interlocking engagement between the first contact surface 20 and the second contact surface 22, except where knurled surfaces are adopted for some alternate embodiments.

In one embodiment, the first and second contacts 12 and 14 are preferably formed out of copper, a metal, an alloy, or an electrical grade alloy. For example, the first contact 12 and second contact 14 can be coated with a coating such as zinc, nickel, a zinc alloy, a nickel alloy, tin over nickel or other known possible metallic coatings or layers. The first and second contacts 12 and 14 may be machined or cast as long as the cast is accurate enough to achieving interlocking engagement between the first contact surface 20 and the second contact surface 22.

In one embodiment, the first and second contacts 12 and 14, or the non-planar mating surfaces thereof, may be manufactured using additive or subtractive manufacturing processes such as three-dimensional printing. For example, patterns in the first contact surface 20 and the second contact surface 22 could be created by additive and subtractive manufacturing, or metal vapor deposition using raw materials such as metals, and alloys, or plastic and polymer composites with metal filler or metal particles embedded therein for suitable electrical conductivity. In one embodiment, the three dimensional printing process could use polymers or plastics with metals or conductive materials embedded therein. In other embodiments, the three dimensional printing process could use conductive graphene layers that are flexible and capable of electrical connection by a conductive adhesive. Three-dimensionalprinting allows creation metallic and insulating objects using one pass manufacturing methods resulting in reduction of manufacturing costs.

The connector assembly 10 can transfer high current electrical energy between a conductor 16 (e.g., cross-sectional conductor size of suitable dimension or dimensions) and a conductive trace (e.g., 115) or conductor (e.g., strip, pad or otherwise) of a circuit board 18 or heat-generating component (e.g., semiconductor switch) in a power inverter or other power electronics. The electrical connector assembly 10 may use one or more of the following features: (1) nontraditional shapes of each conductor or contact member (12, 14) at the circuit board transition, or where the second contact member 14 is mounted, or (2) increased transition surface area through non-planar interface contours, such as ridges, valleys, grooves or waves in mating surfaces of the contact members (12, 14). Reducing the electrical and thermal resistances at the mating surfaces reduces the heat generation and increases the effectiveness of cooling methods.

In one embodiment, the circuit board 18 comprises a dielectric layer 17 with one or more electrically conductive traces, such as metallic trace 115 (in FIG. 1) that overlies the dielectric layer 17. The dielectric layer 17 may be composed of a polymer, a plastic, a polymer composite, a plastic composite, or a ceramic material. The conductive traces may be located on one or both sides of the circuit board 18 along with one or more heat generating elements, such as power semiconductor switches. For example, metallic trace 115 may be coupled to an emitter terminal or a collector of a transistor (e.g., insulated gate bi-polar junction transistor) of a power electronics module (e.g., an inverter) or a source terminal or drain terminal of a field effect transistor of a power electronics module. The metallic trace 115 may carry an alternating current signal of one phase of an inverter or a pulse-width modulated signal, for instance.

Figure 3:
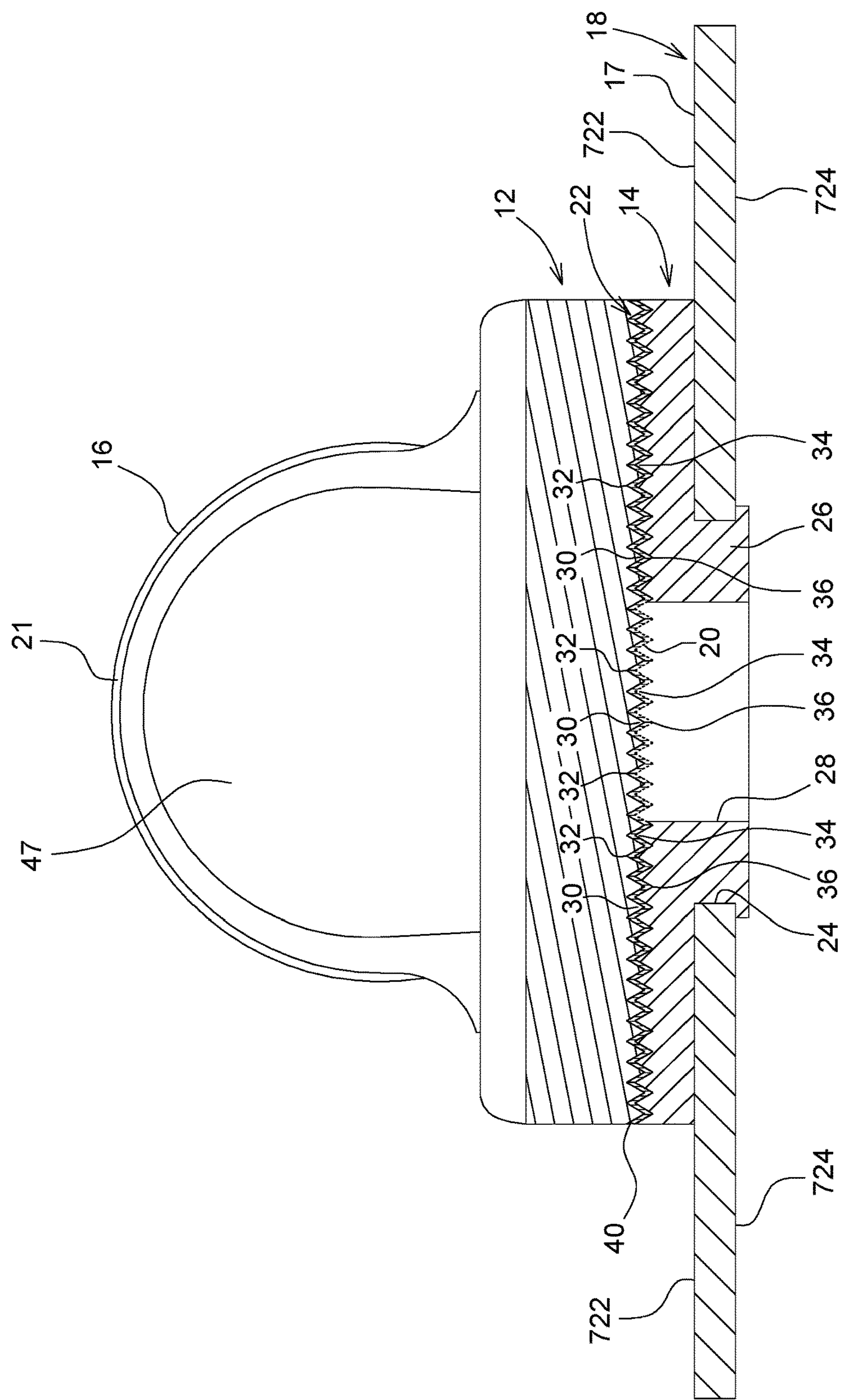
FIG. 3 is a view taken along lines 3-3 of FIG. 1 with the contact elements joined together.
Figure 4:
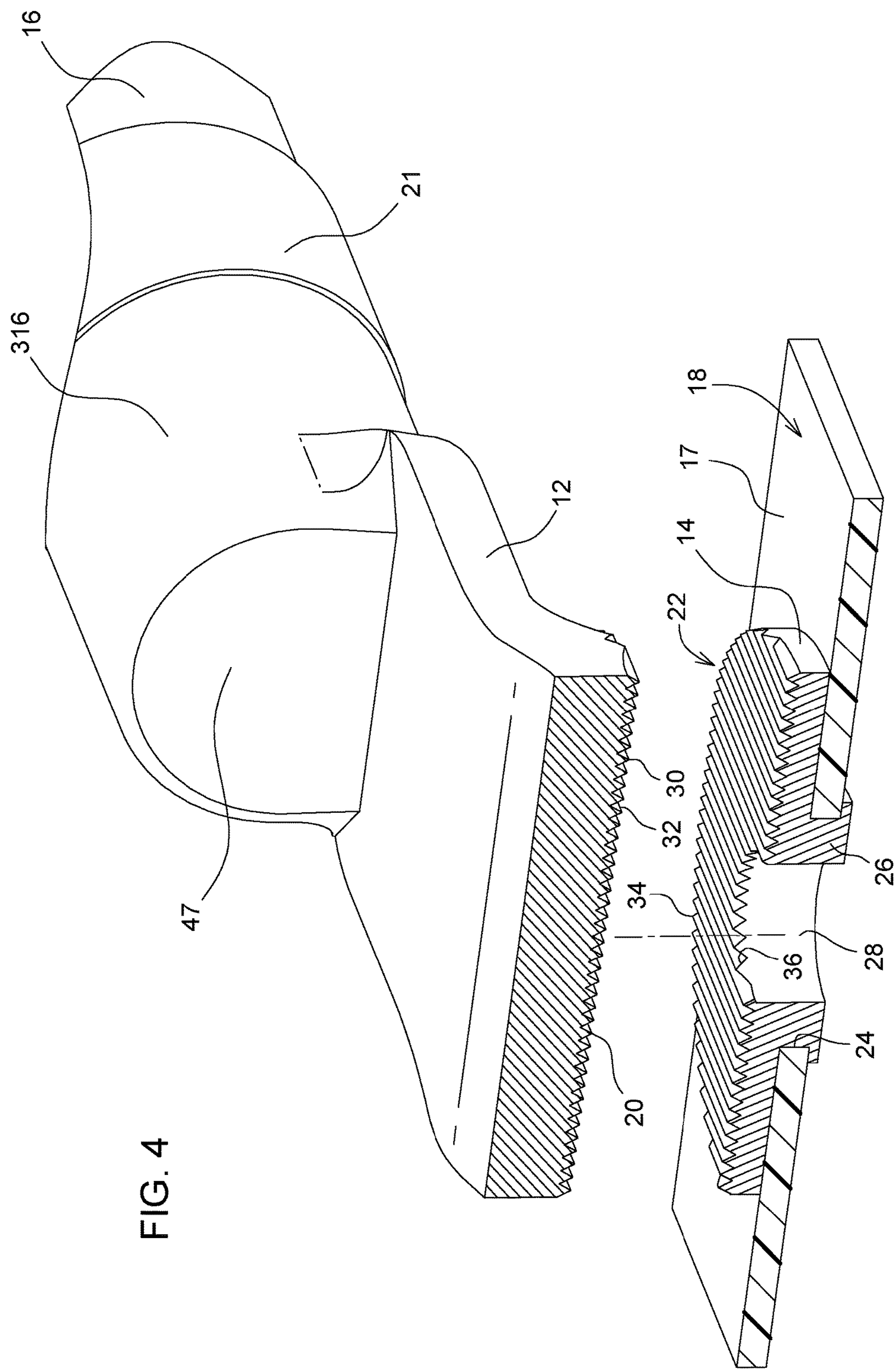
FIG. 4 is an exploded perspective sectional view taken along lines 3-3 of FIG. 1, but with the contact element separated.

As best seen in FIG. 3 and FIG. 4, a bore 24 extends through a dielectric layer 17 of the circuit board 18, and the second contact 14 comprises an annular pad 26 with optional bore 28. The optional bore 28 is coaxially aligned with the bore 24. In one embodiment, the annular pad 26 comprises a hollow conductive stub or metallically plated through-hole. As illustrated, the optional bore 28 or plated through-hole can support an electrical connection to one or more conductive traces on the bottom side of the circuit board 18.

In an alternate embodiment, the optional bore 28 allows excess solder or excess conductive adhesive to be relieved or exhausted during the soldering or connecting of the first contact surface 20 with or toward the second contact surface 22.

Figure 6:
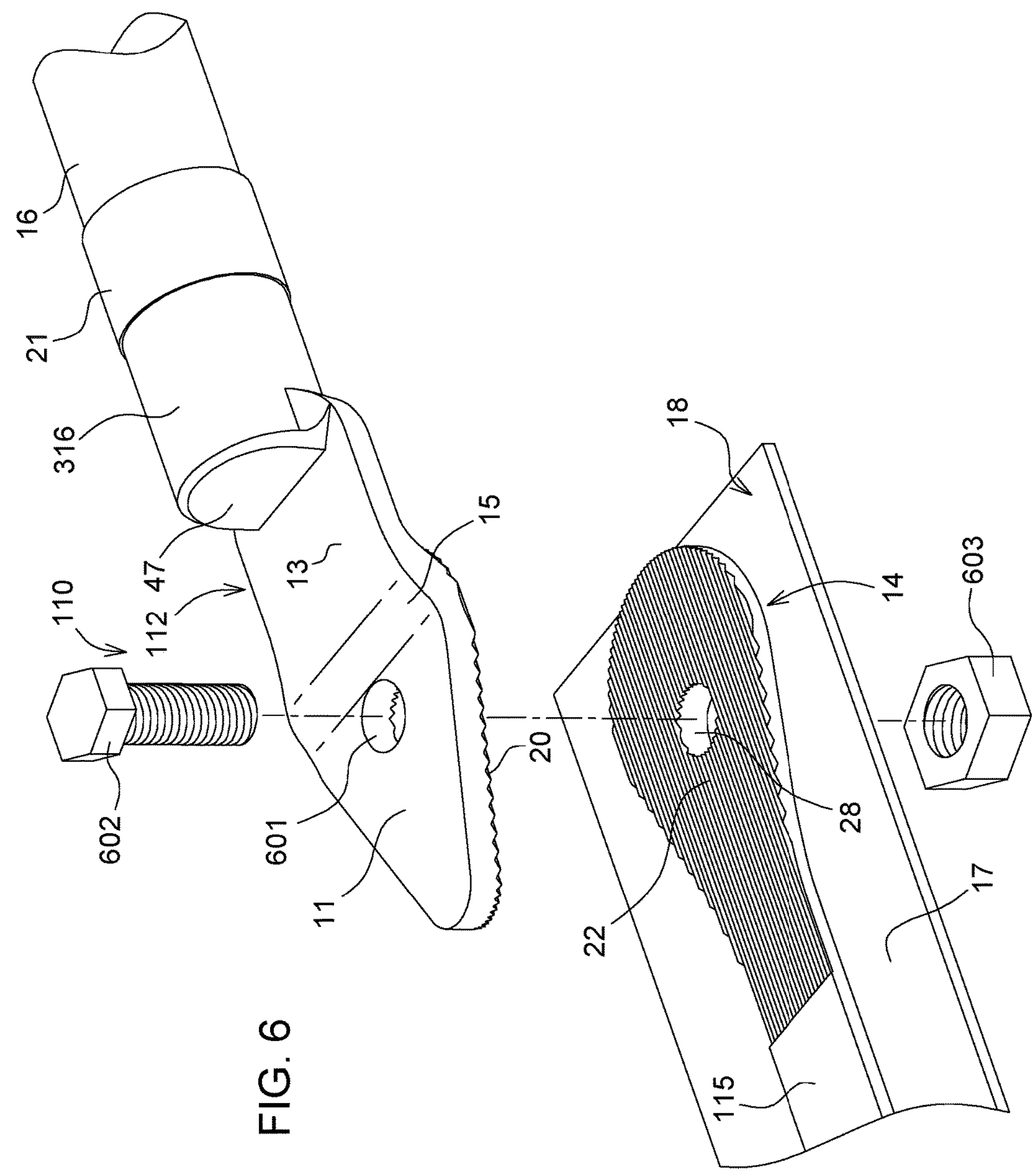
FIG. 6 is an exploded perspective view an alternate embodiment of an electrical connector assembly in accordance with the disclosure.

In place of soldering process, advanced manufacturing processes including vapor phase deposition of conductive materials could be used to form the first and second conductive surfaces (20, 22). With use of vapor phase deposition, manufacturing defects, such as air void in metallic bonds between mating surfaces can be eliminated. For example, voids or similar defects in the first contact surface 20 and the second contact surface 22 can be eliminated; particularly, if the first contact member 12 and the second contact member 14 are electrically and mechanically joined with a fastener (e.g., 602) and/or retainer (e.g., 603) in an alternate embodiment (e.g., as illustrated in FIG. 6).

In FIG. 3 and FIG. 4, both the first contact surface 20 and the second contact surface 22 are non-planar surfaces or non-planar mating surface. Non-planar means ridges 30, valleys 32, grooves, elevations, depressions, or waves are present in the first contact surface 20 or the second contact surface 22. Mating surfaces refers to the first contact surface 20 and the second contact surface 22, collectively. The mating surfaces have suitable size, shape and registration for interlocking engagement of the mating surfaces, with or without an intervening solder layer, braze layer, conductive adhesive layer, or thermal grease layer. In one embodiment, as illustrated in FIG. 3 and FIG. 4, the cross section of the first contact surface 20 comprises a substantially triangular cross-section or a saw-tooth cross section. Similarly, the second contact surface 22 comprises a substantially triangular cross-section or saw-tooth cross section.

As shown, in FIG. 1 through FIG. 4, inclusive, the ridges (30, 34) comprise substantially linear elevations with sloped sides, whereas valleys (32, 36) between each pair of ridges (30, 34) comprise substantially linear depressions with sloped sides. In one configuration, a peak height is measured from a top of each ridge (30, 34) to the bottom of a corresponding valley (32, 36). The first contact surface 20 includes a plurality of elongated first ridges 30 and first valleys 32, where a first valley 32 is positioned between each adjacent pair of first ridges 30. Similarly, the second contact surface 22 includes a plurality of elongated second ridges 34 and second valleys 36, where a second valley 36 is positioned between each adjacent pair of second ridges 34. As best seen in FIG. 3, the first and second surfaces 20, 22 are adjoined, connected or soldered together, directly, in a meshing position or, indirectly, by an intermediary layer 40 of conductive solder, braze conductive adhesive, thermal grease, or otherwise. Thus, first ridges 30 of first contact surface 20 are received by the second valleys 36 of the second contact surface 22, and second ridges 34 of the second contact surface 22 are received by the first valleys 32 of the first contact surface 20.

Figure 5:
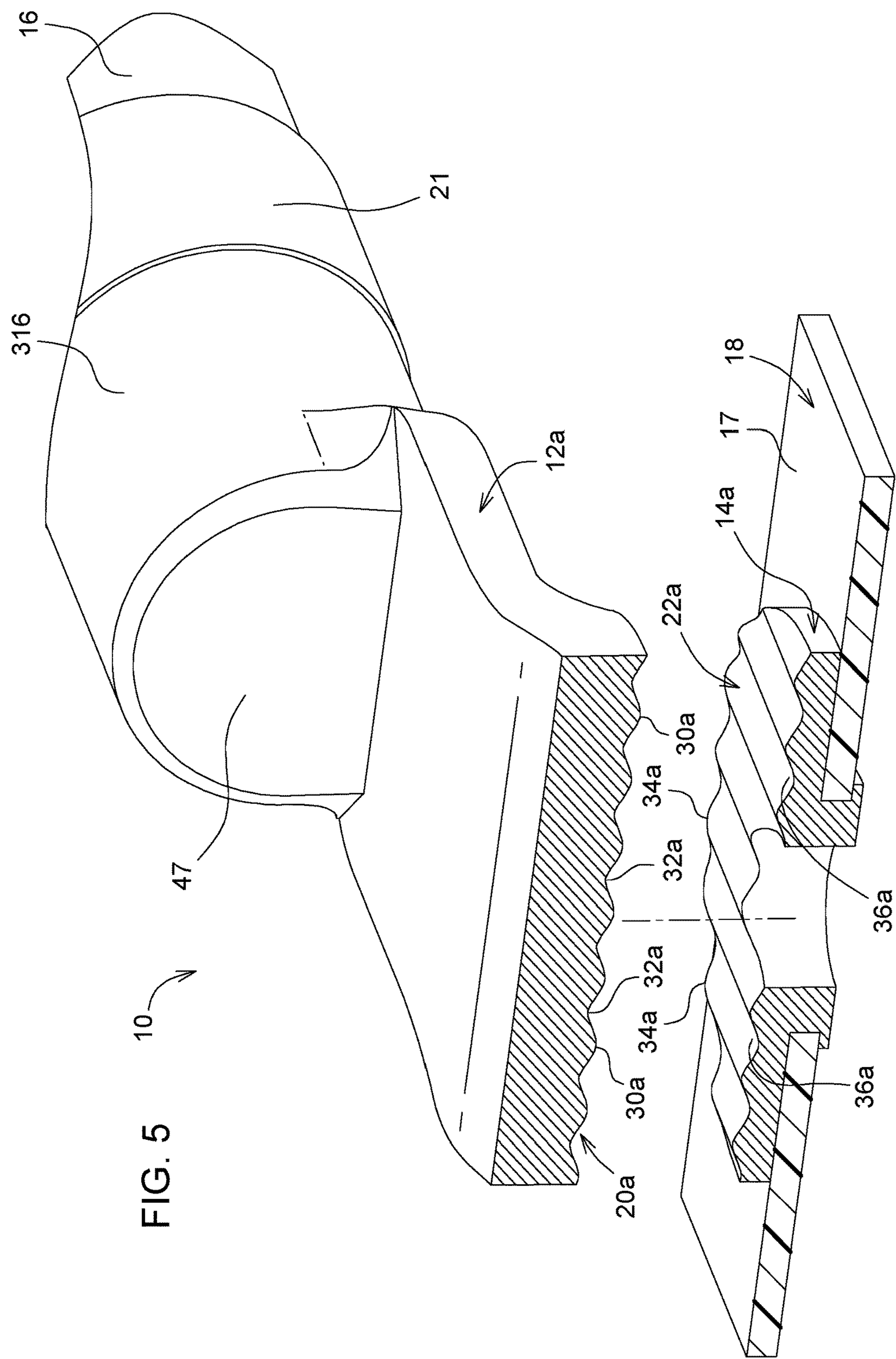
FIG. 5 is an exploded perspective sectional view similar to FIG. 4, but of an alternate embodiment.

FIG. 5 illustrates in an alternate embodiment of a connector assembly. In FIG. 5, the first contact 12*a* has a non-planar first contact surface 20*a* and the second contact 14*a* has a non-planar second contact surface 22*a*. The first contact surface 20*a* includes a plurality of elongated rounded crests 30*a* and rounded depressions 32*a*, where a depression 32*a* is positioned between each adjacent pair of crests 30*a*. Similarly, the second contact surface 22*a* includes a plurality of elongated rounded crests 34*a* and rounded depressions 36*a*, where a depression 36*a* is positioned between each adjacent pair of crests 34*a*. The first and second surfaces 20*a* and 22*a* can also be soldered or connected together in a meshing position by a layer of conductive solder, braze, conductive adhesive, thermal grease, or otherwise. Thus, crests 30*a* of first contact surface 20*a* are received by the depressions 36*a* of the second contact surface 22*a*, and crests 34*a* of the second contact surface 22*a* are received by the depressions 32*a* of the first contact surface 20*a*.

Referring again to FIG. 1, the first contact 12 has a substantially triangular shape (e.g., or a tear-drop shape) with curved corners and the second contact 14 has a substantially circular, substantially elliptical or rounded surface area for thermal transfer of thermal energy from a heat-generating device (e.g., semiconductor switch) mounted on the circuit board 18 to one or more of the following: (1) conductor 16, (2) inner portion 13 or step portion 15, and (3) ambient air around the conductor 16, the inner portion 13, or the step portion 15 (e.g., rise portion). In alternate embodiments, the shape of the contacts (12, 14) can vary from those illustrated in FIG. 1 through FIG. 6, inclusive. The contacts can be funnel-shaped or circular to provide a smooth transition. The contacts could also be diamond or oval-shaped. The interface surfaces 20 and 22 can be a variety of three-dimensional (3D) or non-planar surfaces as long as they increase the surface area of the interface, such as V shaped, diamond, waffle, wave, knurled or tetrahedral. For a knurled surface (not shown), alignment may not be important as with the ridges.

The contacts can be bonded together by a variety of means, such as solder, braze, conductive adhesive, cold-press, and bolting (e.g., with conductive grease). Such interfaces could be applied to a circuit-board-style connection (as illustrated in FIG. 1) or to a bus-bar connection (e.g., with a bus-bar of metal or alloy with a substantially rectangular cross-section or substantially polyhedral cross-section).

Thus, this connector assembly 10 transfers heat away from heat-generating electrical or electronic components on the circuit board or substrate 18. A thermal flow path is supported from the heat-generating component on the circuit board 18 via one or more conductive traces 115 to the second contact 14 on the circuit board 18 and then to the first contact 12 that is connected to the conductor 16. The interface surfaces (20 and 22 or 20*a* and 22*a*) facilitate efficient heat transfer from the second contact (14 or 14*a*) to the first contact (12 or 12*a*) and to the cable or conductor 16 connected to it, which can dissipate the heat to the ambient air. The step 15 in the first contact 12 helps to direct the heat away from the circuit board 18 or substrate. Because of the overall teardrop, curved or rounded triangular shape of the contact members 12 and 14, the heat tends to be directed/channeled toward the first contact member 12 which is attached to the conductor 16.

FIG. 6 is an exploded perspective view an alternate embodiment of an electrical connector assembly 110 in accordance with the disclosure. The electrical connector assembly 110 of FIG. 6 is similar to the electrical connector assembly 10 of FIG. 1, except the electrical connector assembly 110 of FIG. 6 further comprises a hole or opening 601 in the first contact member 112 that is aligned with the bore 28 (in the second contact member 14) for receipt of a fastener, such as fastener 602 (e.g., threaded bolt or screw) and retainer 603 (e.g., nut). Like reference numbers in FIG. 1 and FIG. 2 indicate like elements or features.

In certain prior art electronic power modules, such as power inverters, an increase of electrical resistance at an electrical contact interface results in heat generation, which compounds thermal issues. With the connector assembly disclosed in this document, the peak overloading of the electronic power module can be managed while keeping the electronic power module compact (e.g., for installation on a vehicle). The connector assembly has decreased interface thermal resistance while keeping package size compact and smaller than conventional connector assemblies. The shape of the transition area or step promotes an easy flow path for the thermal and electrical energy that passes through it. The contact surface area of the connector assembly is increase at the transition for heat dissipation to ambient air, whereas overall envelop of the connector assembly remains compact by using three-dimensional, non-planar mating surfaces. This conductor assembly can be cooled from two sides or opposite sides of the circuit board 18.

The conductor assembly is well-suited for thermal transfer because of the shape of the conductive contact members, or their respective (interlocking) mating surfaces, at the transition between the first contact surface and the second contact surface, and the non-planar form of the interface/mating surfaces. The shape of the contacts and mating surfaces promotes a smooth flow of electrical current and thermal heat from one contact member (e.g., 12, 14) to the other so that the transition area does not create appreciable electrical or thermal resistance. The transition or interface between the mating surfaces will always be a point where there is a natural thermal resistance. To compensate, there is an increase in surface area at the transition or step from one conductor contact surface to other conductor contact surface, and with this design, the transition surface or step area is increased without increasing the envelope size of the contact assembly.

Figure 7:
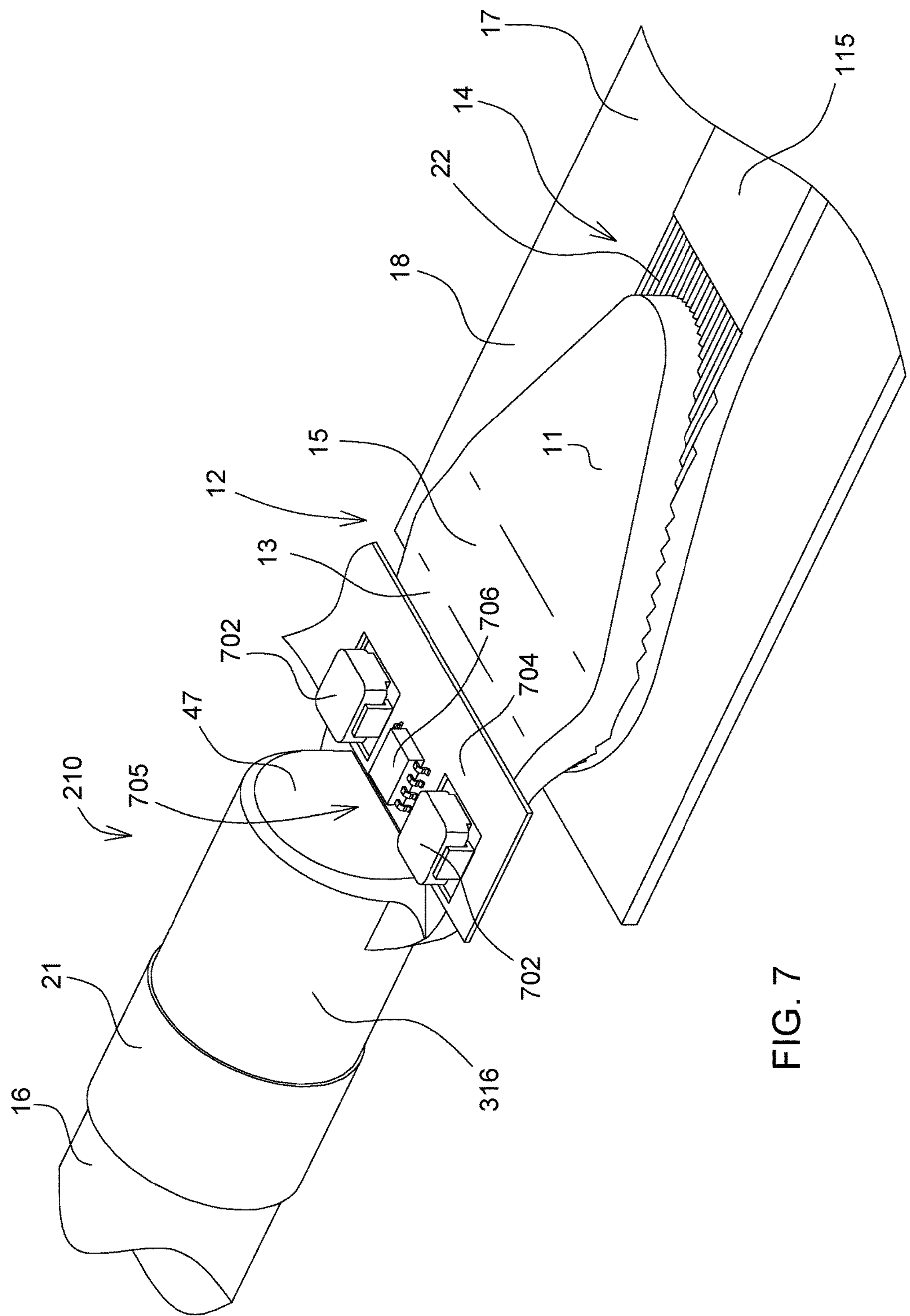
FIG. 7 is a perspective view of one embodiment of an electrical connector assembly with one configuration of a current sensor.

FIG. 7 is a perspective view of one embodiment of an electrical connector assembly 210 with a first configuration of a current sensor 705. Like reference numbers in FIG. 1 and FIG. 7 through FIG. 9, indicate like elements or features.

Figure 8:
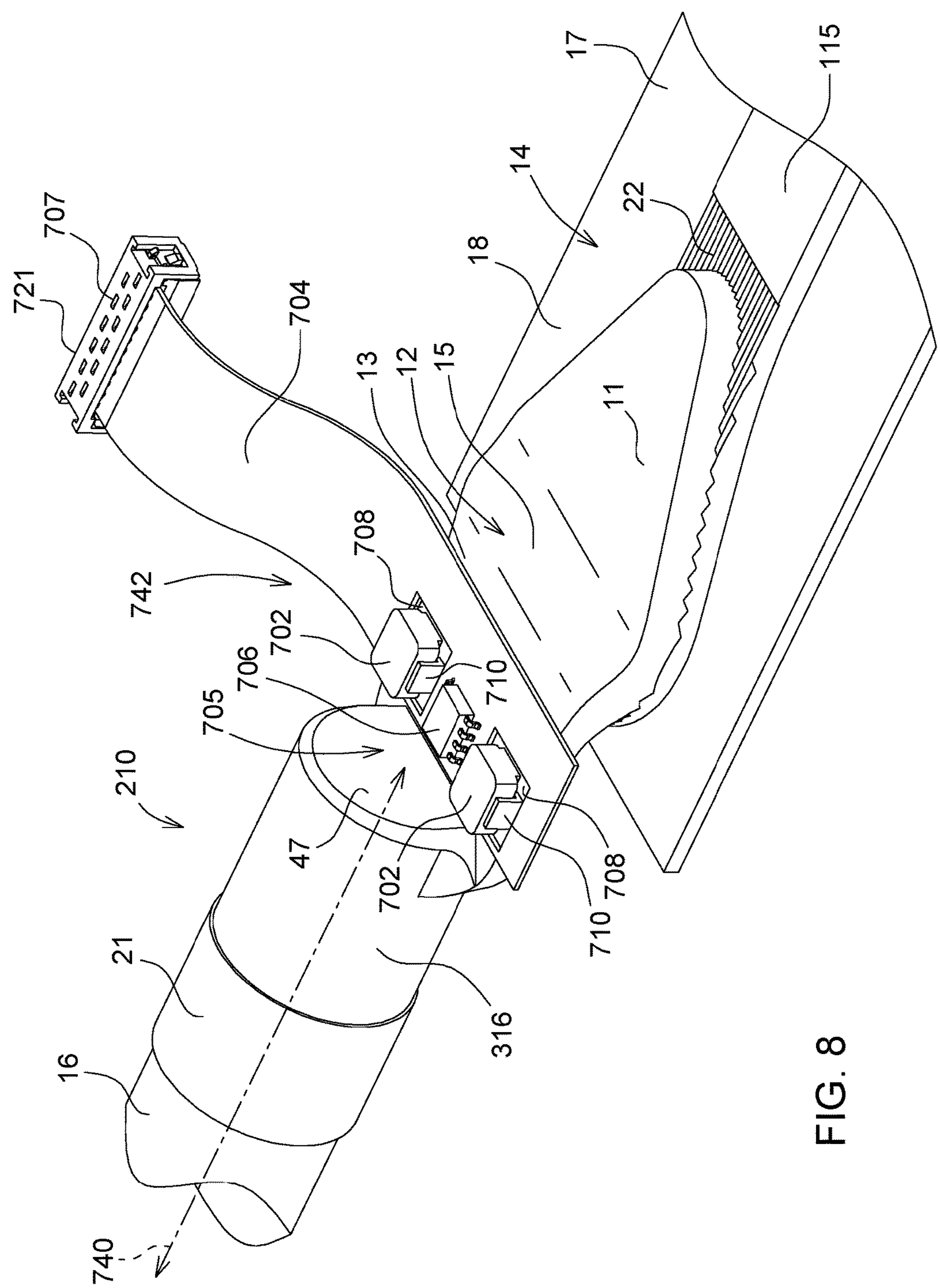
FIG. 8 is a perspective view of one embodiment of an electrical connector assembly with another configuration of a current sensor.

As illustrated in FIG. 7 and FIG. 8, the current sensor 705 is integrated into the electrical connector assembly 210. In certain embodiments, the current sensor 705 may support high bandwidth for sensing the electrical current of alternating current signal carried by the electrical connector assembly 210. Magnetic field concentrators 702 are spaced apart to concentrate a magnetic field in a zone. The magnetic field is associated with electric current carried by the electrical connector assembly 210. A flexible circuit carrier 704 has openings 708 to receive the magnetic field concentrators 702. The flexible circuit carrier 704 comprises a flexible dielectric layer and a conductive traces. In one embodiment, the conductive traces may be internal to the flexible circuit carrier with the exception of metallic pads or metal plated through-holes for mounting a magnetic field sensor. A magnetic field sensor 706 is mounted on the flexible circuit carrier 704 in the zone to detect the magnetic field; hence, measure the current carried by the electrical connector assembly 210.

The flexible circuit carrier 704 comprises a flexible dielectric layer and a conductive traces that supply electrical energy to the magnetic field sensor 706, and that carry output signals indicative of the electrical current in the electrical connector assembly 210. In one embodiment, the conductive traces terminate in a connector 707 (in FIG. 8) with a dielectric body 721 and multiple conductive pins or pin receptacles, wherein the connector 707 is selected from the group consisting of a card-edge connector, a circuit board transition header and a ribbon cable connector. The dielectric layer of the flexible circuit carrier 704 is composed of polyimide, a flexible or resilient polymer, or a flexible or resilient plastic material. In one embodiment, the conductive traces may comprise copper traces or embedded metallic wires.

In one configuration, the electrical connector assembly 210 is associated with or mounted on a substrate, such as a circuit board 18. For example, the circuit board 18 comprises a dielectric layer 17, metallic traces 115 and a conductive via or metallized through-hole that is integral with, or mechanically and electrically connected to, the second electrically conductive contact member 14. In the embodiment of FIG. 7 and FIG. 8, the conductive via or metallized through-hole 28 (in FIG. 1) extends from or below the second electrically conductive contact member 14. In one configuration, the second electrically conductive contact member 14 comprises a conductive pad (e.g., 22) on a first side 722 of the circuit board and extends through a conductive via or a metallized through-hole 28 to a second side 724 of the circuit board opposite the first side 722 to support double-sided cooling of the connector assembly 210 on the circuit board.

The circuit board 18 can operate at temperatures in a range between approximately 100 degrees Celsius and approximately 120 degrees Celsius by dissipating thermal energy to ambient air via the double-sided cooling and the electrical connector assembly 210. Accordingly, the electrical connector assembly 210 is well-suited for operating with inlet coolant temperatures set at or below 105 degrees Celsius, which is representative of the coolant temperature of engine coolant of a vehicle.

As illustrated in FIG. 7, the current sensor is mounted on an outer surface or upper surface of the electrical connector assembly 210; the current sensor comprises a set of magnetic field concentrators 702, where a magnetic field sensor 706 can be mounted above or between the magnetic field concentrators 702 in proximity or alignment of any concentration of magnetic flux produced by the magnetic field concentrators 704.

FIG. 8 is a perspective view of one embodiment of an electrical connector assembly 210 with another configuration of a current sensor 705. The configuration of FIG. 8 is similar to the configuration of FIG. 7, except FIG. 8 further shows the magnetic field sensor 706 and the flexible circuit carrier 704 that terminates in a connector 707 (e.g., ribbon connector or card edge connector). Like reference numbers in FIG. 8 and FIG. 7 indicate like elements.

For example as shown in FIG. 8, a flexible circuit carrier 704 comprises a flexible dielectric body or ribbon with conductive traces and openings 708 to receive the magnetic field concentrators. As shown, the magnetic field concentrators 702 extend above the flexible circuit carrier 704 and there is clearance gap between an outer perimeter of each magnetic field concentrator 702 and the contour of the openings 708. A magnetic field sensor 706 is mounted to the flexible circuit carrier 704 and the terminals of the magnetic field sensor 706 are electrically connected to the circuit traces of the flexible circuit carrier 704 by solder or a conductive adhesive.

In one embodiment, the magnetic field sensor 706 comprises any device for sensing a magnetic field, such as a Hall-effect sensor. In some embodiments, the current sensor 705 is also significantly miniaturized as compared to conventional toroidal core sensors and Hall-effect sensors. Therefore, current sensor 705 that is integrated with the power connector supports cost, weight, and volume reduction of electronic assemblies (e.g., power inverters for vehicles).

As shown in the illustrative embodiment of FIG. 8, the magnetic field sensor 706 comprises a magnetic field sensor integrated circuit (IC) chip or current sensor 705 that uses magnetic field concentrators 702 on sides radially outward from a central axis 740 of a conductor 16 connected to the electrical connector assembly 210 to reduce or eliminate effects of stray magnetic fields and to strengthen magnetic field observed or observable by the magnetic field sensor 706. For instance, the concentrators 702 are adhesively bonded or adhered to the connector itself, where the magnetic field sensor 706 is surface mounted on a flexible circuit carrier 704 by soldering or conductive adhesive to conductive pads on the flexible circuit board. The circuit assembly 742 of the flexible circuit board 704 and the magnetic field sensor 706 has openings that align with the concentrators. To keep the circuit assembly 742 in place, the circuit assembly 742 could be adhered to the electrical connector assembly 210, retained to the electrical connector assembly 210 via dielectric retainer or clips 710, or by using a dielectric protrusion (e.g., extending inward into the housing toward the flexible circuit) or other retention features within the inverter housing.

Collectively, the circuit assembly 742 and concentrators 702 form a miniaturized current sensor 705 that takes a minimal space on the electrical connector assembly 210 and leaves adequate area for double sided cooling with heat sinks or other similar methods.

Figure 9:
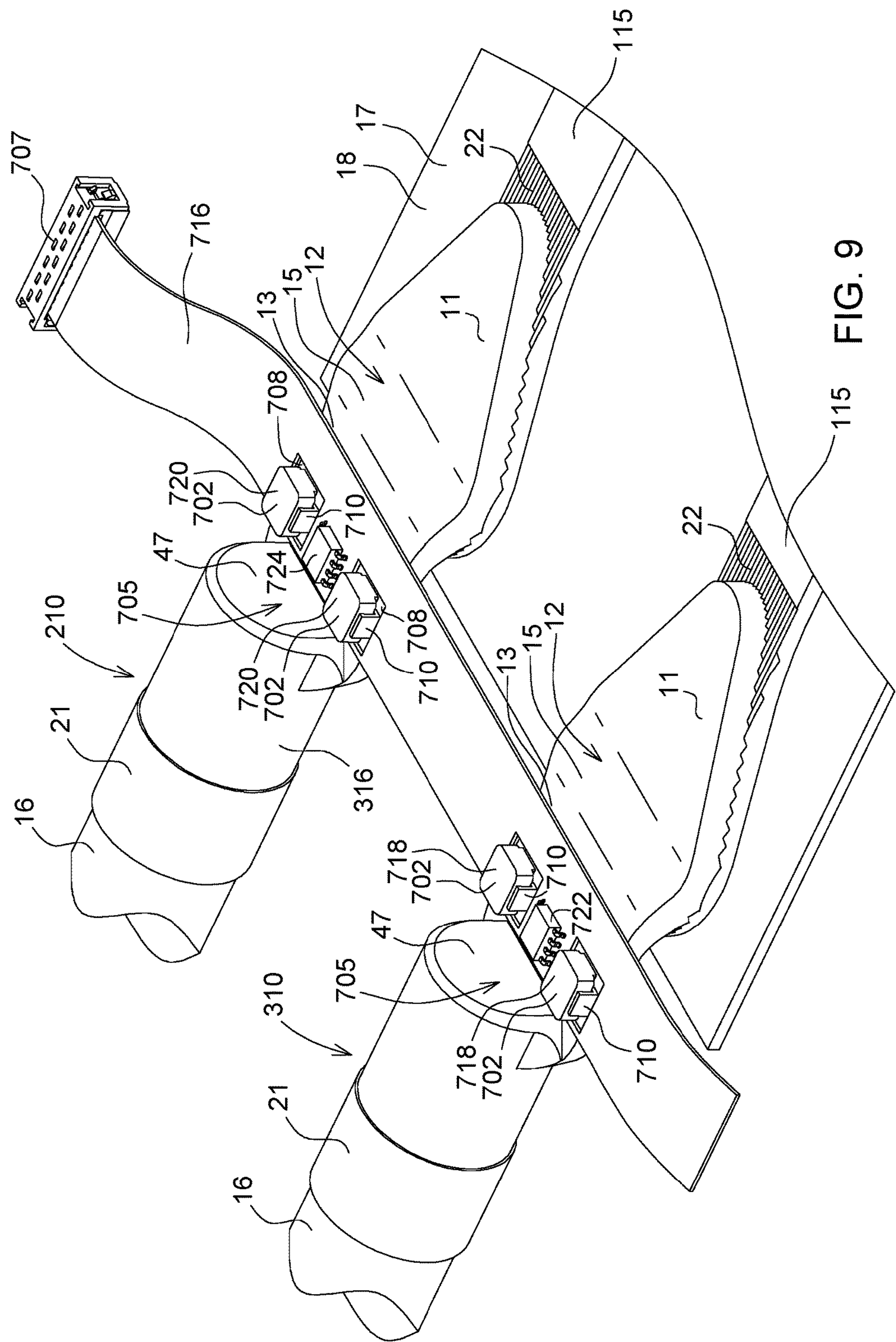
FIG. 9 is a perspective view of one embodiment of a plurality of electrical connector assemblies with respective current sensors.

FIG. 9 is a perspective view of one embodiment of a plurality of electrical connector assemblies with respective current sensors 705. The configuration of FIG. 9 is similar to the configuration of FIG. 7 and FIG. 8, except in FIG. 9 one flexible circuit carrier 716 supports multiple current sensors 705 added to monitor current through multiple connectors (210, 310). Like reference numbers in FIG. 7 through FIG. 9, inclusive, indicate like elements.

In FIG. 9, an electrical connector assembly comprises a first connector 210 and a second connector 310. The first connector 210 comprises a first electrically conductive contact member and a second electrically conductive contact member. The first contact member has a non-planar first interface surface. The second contact member has a non-planar second interface surface which is complementary to the first interface surface and which engages the first interface surface. A second connector 310 comprises a first electrically conductive contact member and a second electrically conductive contact member. The first contact member has a non-planar first interface surface. The second contact member has a non-planar second interface surface which is complementary to the first interface surface and which engages the first interface surface.

A first magnetic field is associated with electric current carried by the first connector 210. A first pair 720 of magnetic field concentrators 702 is spaced apart to concentrate the first magnetic field 724 in a first zone. A first magnetic field sensor 724 is mounted on the flexible circuit carrier 704 in the first zone. The first magnetic field sensor 724 detects the first magnetic field; hence, the first current in the first connector. In one configuration, the first magnetic field sensor 724 is the same as or analogous to the magnetic field sensor 706 of FIG. 7, for example.

A second magnetic field is associated with electric current carried by the second connector 310. The second pair 718 of magnetic field concentrators 702 is spaced apart to concentrate in a second magnetic field in a second zone. The second magnetic field sensor 722 detects the second magnetic field; hence, the second current in the second connector 310. In one configuration, the second magnetic field sensor 722 is the same as or analogous to the magnetic field sensor 706 of FIG. 7, for example.

As shown in FIG. 9, the flexible circuit carrier 716 has openings to receive the first pair 720 of magnetic field concentrators 702 and the second pair 718 of magnetic field concentrators 702. The flexible circuit carrier 704 comprises a flexible dielectric layer and a conductive traces that supply electrical energy to the first magnetic field sensor 724 and the second field sensor 722, and that carry output signals indicative of the first current and the second current. While the disclosure has been illustrated and described in detail in the drawings and foregoing description, such illustration and description is to be considered as exemplary and not restrictive in character, it being understood that illustrative embodiments have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

What is claimed is:

1. An electrical connector assembly, comprising:

a first electrically conductive contact member, the first contact member having a non-planar first interface surface;

a second electrically conductive contact member, the second contact member having a non-planar second interface surface which is complementary to the first interface surface and which engages the first interface surface, a plurality of magnetic field concentrators spaced apart to concentrate a magnetic field in a zone, the magnetic field associated with electric current carried by the electrical connector assembly;

a flexible circuit carrier with openings to receive the magnetic field concentrators, the flexible circuit carrier comprising a flexible dielectric layer and a conductive traces; and a magnetic field sensor for mounting on the flexible circuit carrier in the zone, the magnetic field sensor configured to measure the electric current.

2. The electrical connector assembly of claim 1 wherein the conductive traces terminate in metallic conductive pads that are electrically and mechanically connected to the magnetic field sensor.

3. The electrical connector assembly of claim 1 wherein the conductive traces terminate in a connector with a dielectric body and multiple conductive pins or pin receptacles, wherein the connector is selected from the group consisting of a card-edge connector, a circuit board transition header and a ribbon cable connector.

4. The electrical connector assembly of claim 1 wherein the dielectric layer of the flexible circuit carrier is composed of polyimide.

5. The electrical connector assembly of claim 1 further comprising:

a circuit board comprising a dielectric layer; wherein:

the second electrically conductive contact surface comprises a conductive pad on a first side of the circuit board and extending through a conductive via or a metallized through-hole to a second side of the circuit board opposite the first side to support double-sided cooling of the connector assembly on the circuit board.

6. The electrical connector assembly of claim 5 wherein the circuit board operates at temperatures in a range between approximately 100 degrees Celsius and approximately 110 degrees Celsius by dissipating thermal energy to ambient air via the double-sided cooling and the electrical connector assembly.

7. The electrical connector assembly of claim 1, wherein:

the first interface surface includes a plurality of elongated first ridges and a plurality of elongated first valleys; and the second interface surface includes a plurality of elongated second ridges and a plurality of elongated second valleys.

8. The electrical connector assembly of claim 7, wherein:

a first ridge is received by a second valley and a second ridge is received by a first valley.

9. The electrical connector assembly of claim 1, wherein:

the second contact member is soldered to the first contact member.

10. The electrical connector assembly of claim 1, wherein:

the second contact member is bonded to the first contact member by a layer of solder.

11. The electrical connector assembly of claim 1, wherein:

the first contact includes an outer portion and an inner portion which offset from the first portion, and the inner portion is connected to the outer portion by a step portion.

12. The electrical connector assembly of claim 1, wherein:

the first interface surface includes a plurality of elongated rounded crests and a plurality of elongated rounded depressions; and the second interface surface includes a plurality of elongated rounded crests and a plurality of elongated rounded depressions.

13. An electrical connector assembly, comprising:

a first connector comprising a first electrically conductive contact member and a second electrically conductive contact member, the first contact member having a non-planar first interface surface, the second contact member having a non-planar second interface surface which is complementary to the first interface surface and which engages the first interface surface;

a first pair of magnetic field concentrators spaced apart to concentrate a first magnetic field in a first zone, the first magnetic field associated with electric current carried by the first connector;

a flexible circuit carrier with openings to receive the first pair of magnetic field concentrators, the flexible circuit carrier comprising a flexible dielectric layer and conductive traces; and a first magnetic field sensor for mounting on the flexible circuit carrier in the first zone, the magnetic field sensor configured to measure the electric current.

14. The electrical connector assembly according to claim 13 further comprising:

a second connector comprising a first electrically conductive contact member and a second electrically conductive contact member, the first contact member having a non-planar first interface surface, the second contact member having a non-planar second interface surface which is complementary to the first interface surface and which engages the first interface surface;

a second pair of magnetic field concentrators spaced apart to concentrate in a second magnetic field in a second zone, the second magnetic field associated with electric current carried by the second connector;

the flexible circuit carrier with openings to receive the second pair of magnetic field concentrators, the flexible circuit carrier comprising a flexible dielectric layer and a conductive traces; and a second magnetic field sensor for mounting on the flexible circuit carrier in the second zone.

* * * * *